(12) United States Patent
Brew et al.

(10) Patent No.: US 12,002,753 B2
(45) Date of Patent: Jun. 4, 2024

(54) ELECTRONIC FUSE WITH PASSIVE TWO-TERMINAL PHASE CHANGE MATERIAL AND METHOD OF FABRICATION

(71) Applicant: International Business Machines Corporation, Armonk, NY (US)

(72) Inventors: Kevin W. Brew, Niskayuna, NY (US); Lan Yu, Voorheesville, NY (US); Ruilong Xie, Niskayuna, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/545,260

(22) Filed: Dec. 8, 2021

(65) Prior Publication Data
US 2023/0178483 A1  Jun. 8, 2023

(51) Int. Cl.
*H01L 23/525* (2006.01)

(52) U.S. Cl.
CPC .................. *H01L 23/5256* (2013.01)

(58) Field of Classification Search
CPC ......... H01L 23/5256; H01L 2924/1453; H01L 23/525–5258; H10B 20/20–25; G11C 17/14–165
See application file for complete search history.

(56) References Cited

U.S. PATENT DOCUMENTS

| | | |
|---|---|---|
| 6,611,039 B2 | 8/2003 | Anthony |
| 6,815,704 B1 | 11/2004 | Chen |
| 7,321,130 B2 | 1/2008 | Lung |
| 7,394,089 B2 | 7/2008 | Doyle |
| 7,411,818 B1 | 8/2008 | Elmegreen et al. |
| 7,514,288 B2 | 4/2009 | Lung et al. |
| 7,579,613 B2 | 8/2009 | Lung et al. |
| 7,728,320 B2 | 6/2010 | Chen |
| 7,777,296 B2 | 8/2010 | Yang |

(Continued)

FOREIGN PATENT DOCUMENTS

| | | |
|---|---|---|
| CN | 100495622 C | 7/2007 |
| CN | 101131989 A | 2/2008 |
| JP | 4185338 B2 | 6/2003 |

OTHER PUBLICATIONS

Gang Liu et al. "Polysilicon Fuse Electrical Voiding Mechanism" AP/DFM: Advanced Patterning/Design for Manufacturability [retrieved Dec. 8, 2021].

(Continued)

*Primary Examiner* — Laura M Menz
*Assistant Examiner* — Candice Chan
(74) *Attorney, Agent, or Firm* — Robert R. Aragona (57) ABSTRACT

A semiconductor structure includes a first electrode; a second electrode; a dielectric material between the first electrode and the second electrode, the dielectric material having at least one wall extending from the first electrode to the second electrode to define a void within the dielectric material and between the first electrode and the second electrode; and a layer of phase change material on the at least one wall of the dielectric material and in contact with the first electrode and the second electrode.

6 Claims, 11 Drawing Sheets

(56) References Cited

U.S. PATENT DOCUMENTS

| | | | |
|---|---|---|---|
| 8,062,923 | B2 | 11/2011 | Lung |
| 10,505,111 | B1 | 12/2019 | Ok et al. |
| 2003/0062590 | A1 | 4/2003 | Anthony |
| 2006/0231921 | A1 | 10/2006 | Van Kampen et al. |
| 2006/0284279 | A1 | 12/2006 | Lung et al. |
| 2007/0274121 | A1* | 11/2007 | Lung .................. H01L 45/1226 257/E45.002 |
| 2008/0048169 | A1 | 2/2008 | Doyle et al. |
| 2008/0186760 | A1 | 8/2008 | Elmegreen et al. |
| 2009/0039331 | A1 | 2/2009 | Clevenger et al. |
| 2011/0001107 | A1* | 1/2011 | Zheng ................. H10N 70/068 438/102 |
| 2011/0317324 | A1* | 12/2011 | Clevenger ......... H01L 31/02021 361/103 |
| 2018/0025977 | A1* | 1/2018 | Yang .................. H01L 23/5252 257/530 |

OTHER PUBLICATIONS

K.N. Chen et al. "Programmable via Using Indirectly Heated Phase-Change Switch for Reconfigurable Logic Applications" IEEE Electron Device Letters, vol. 29 No. Jan. 1, 2008.

Chen, et al., "Programmable via Using Indirectly Heated Phase-Change Switch for Reconfigurable Logic Applications", IEEE Electron Device Letters, vol. 29, No. 1, Jan. 2008, 3 Pages.

Panguloori, "Basics of eFuses", Texas Instruments, Application Report, SLVA862A, Apr. 2018, 14 Pages.

ST, E-fuses, https://www.st.com/en/power-management/e-fuses.html, Accessed on Jan. 25, 2024, 2 Pages.

* cited by examiner

ELECTRONIC FUSE WITH PASSIVE TWO-TERMINAL PHASE CHANGE MATERIAL AND METHOD OF FABRICATION

BACKGROUND

The exemplary embodiments described herein relate generally to electronic circuitry and, more specifically, to electronic circuitry in which fuses are incorporated.

Standard fuses for use with electronic circuitry operate with the ability to detect and quickly react to overvoltage and overcurrent conditions. Such fuses typically operate using a combination of diodes, MOSFETs, and TVS (transient-voltage suppression devices, such as Zener diodes). Some older fuse technologies utilize Ni—Cr alloys that have a tendency to grow back once broken. More recent fuse technologies may be polymer-based and utilize polysilicon transmission lines that enable the use of much lower voltages for operation (2-3 V (volts)) and up to speeds of 100 ns (nanoseconds).

Electronic fuses may be incorporated into electronic circuitry on computer chips to allow for the dynamic real-time reprogramming of the chips. By incorporating a set of electronic fuses into a single chip, a manufacturer can allow for circuits on the chip to change while the chips are operating. Although such electronic fuses may be microscopic in size, they generally have multiple components and are arranged in complex configurations with other chip components.

The inadvertent shorting of chip components, however, can cause high potentials to be applied in the circuit. Electronic fuses can trip and prevent the high potentials and high current from affecting devices connected to the circuit. When connected in series to a main power rail, an electronic fuse operates similar to a standard fuse due to an inherent ability to detect and quickly react to overcurrent and overvoltage conditions. These electronic fuses are one-time programmable in that once tripped, they cannot be reset.

BRIEF SUMMARY

In one exemplary aspect, a semiconductor structure comprises a first electrode; a second electrode; a dielectric material between the first electrode and the second electrode, the dielectric material having at least one wall extending from the first electrode to the second electrode to define a void within the dielectric material and between the first electrode and the second electrode; and a layer of phase change material on the at least one wall of the dielectric material and in contact with the first electrode and the second electrode.

In another exemplary aspect, a method of forming an electronic fuse comprises providing a first dielectric layer on a substrate; forming a trench in the first dielectric layer; forming a first electrode in the trench; depositing a second dielectric layer on the first electrode and the first dielectric layer; forming a pore in the second dielectric layer to expose a portion of the first electrode; depositing a layer of phase change material, in an amorphous phase, on at least one wall of the pore and contacting the first electrode such that a void is defined in the pore; filling the defined void with a sacrificial material; causing the phase change material to assume a crystalline phase; removing the sacrificial material to redefine the void; forming a metal bridge over the void; removing portions of the metal bridge to expose the second dielectric layer; and covering the exposed second dielectric layer with a third dielectric layer.

In another exemplary aspect, a method of forming an electronic fuse comprises forming a first electrode on an insulating layer; forming a second electrode on the insulating layer and in-plane with the first electrode; depositing a sacrificial material on the insulating material between and separating the first electrode and the second electrode; depositing a phase change material, in an amorphous phase, onto and overlaying the sacrificial material such that the sacrificial material extends over at least a portion of the first electrode, at least a portion of the second electrode, all of the sacrificial material, and at least a portion of the insulating layer; causing the phase change material to assume a crystalline phase; removing the sacrificial material to form an air gap; and depositing a wetting dielectric on the phase change material.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments described herein involve the fabrication of semiconductor structures that utilize a passive 2-terminal phase change material (PCM) that is capable of providing protection to electronic components from over-current/voltage applications. Such semiconductor structures generally comprise electronic fuses. In protecting the electronic components, the electronic fuse reacts to an application of an excessive amount of current or voltage to switch open a circuit. In the embodiments described herein, the electronic fuses are of dimensions that are sufficient to allow their placement into a circuit on a computer chip and are hereinafter referred to as "nanofuses."

Phase change materials (PCM) are capable of being switched between a first structural state in which the material is in a generally amorphous solid phase and a second structural state in which the material is in a generally crystalline solid phase in an active region of a cell. The term "amorphous" is used to refer to a relatively less ordered structure, more disordered than a single crystal, which has the detectable characteristics such as higher electrical resistivity as compared to the crystalline phase. The term "crystalline" is used to refer to a relatively more ordered structure, more ordered than in an amorphous structure, which has detectable characteristics such as lower electrical resistivity as compared to the amorphous phase. Other material characteristics affected by the change between amorphous and crystalline phases include atomic order, free electron density, and activation energy. The material can be switched into either different solid phases or mixtures of two or more solid phases, providing a gray scale between completely amorphous and completely crystalline phases.

The change from the amorphous to the crystalline phase is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous phase.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors, and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Figure 1A:
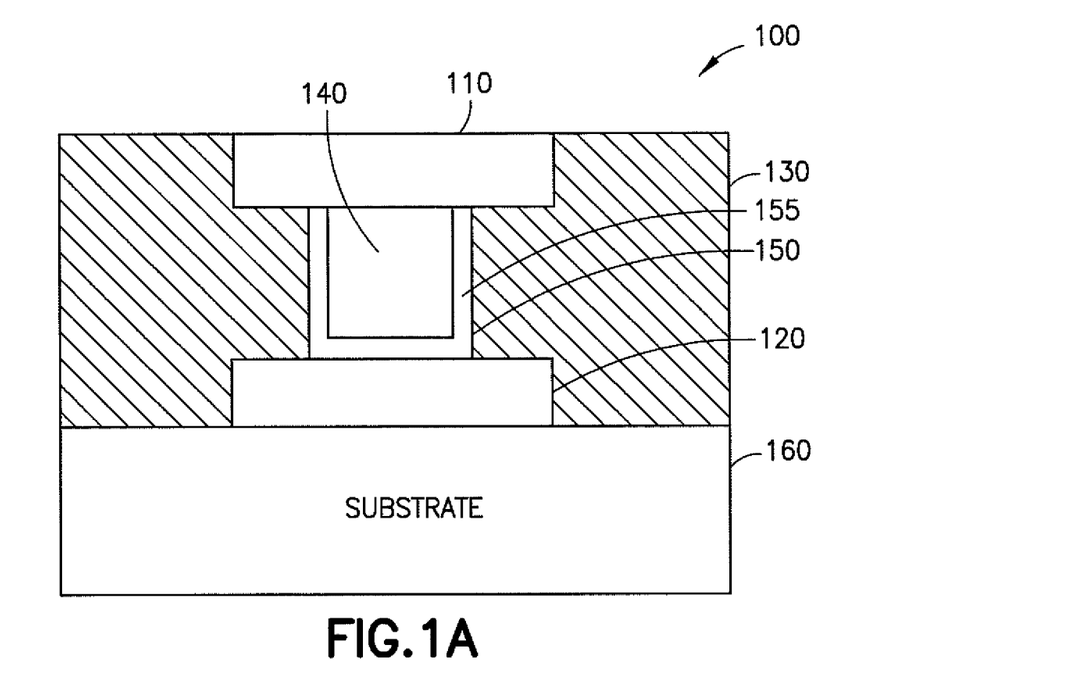
FIG. 1A is a schematic representation of an electronic nanofuse.

In one exemplary embodiment, referring to FIG. 1A, a structure for a nanofuse for use in an electronic circuit is shown generally at 100. Nanofuse 100 comprises a top electrode 110, a bottom electrode 120, and a dielectric layer 130 between and separating the top electrode 110 and the bottom electrode 120. A void or air gap 140 is disposed in the dielectric layer 130 between the top electrode 110 and the bottom electrode 120. A phase change material 150 (PCM 150) is disposed as a layer on one or more walls defining the air gap 140. As shown, the PCM 150 may also be disposed on a surface of the bottom electrode 120 (or the top electrode 110) and between the one or more walls defining the air gap 140. In a finished form of the nanofuse 100, the PCM 150 extends between the top electrode 110 and the bottom electrode 120 such that electrical communication can be maintained from the top electrode 110 through the PCM 150 and to the bottom electrode 120 with the air gap 140 being maintained. In fabrication of the nanofuse 100, the bottom electrode 120 may be disposed on a substrate 160.

In the nanofuse 100, the PCM 150 is in a crystalline phase and has a low resistance. The PCM 150 may comprise materials as described herein.

When a circuit into which the nanofuse 100 is incorporated is functioning normally, current flows between the electrodes and through the PCM 150.

Figure 1B:
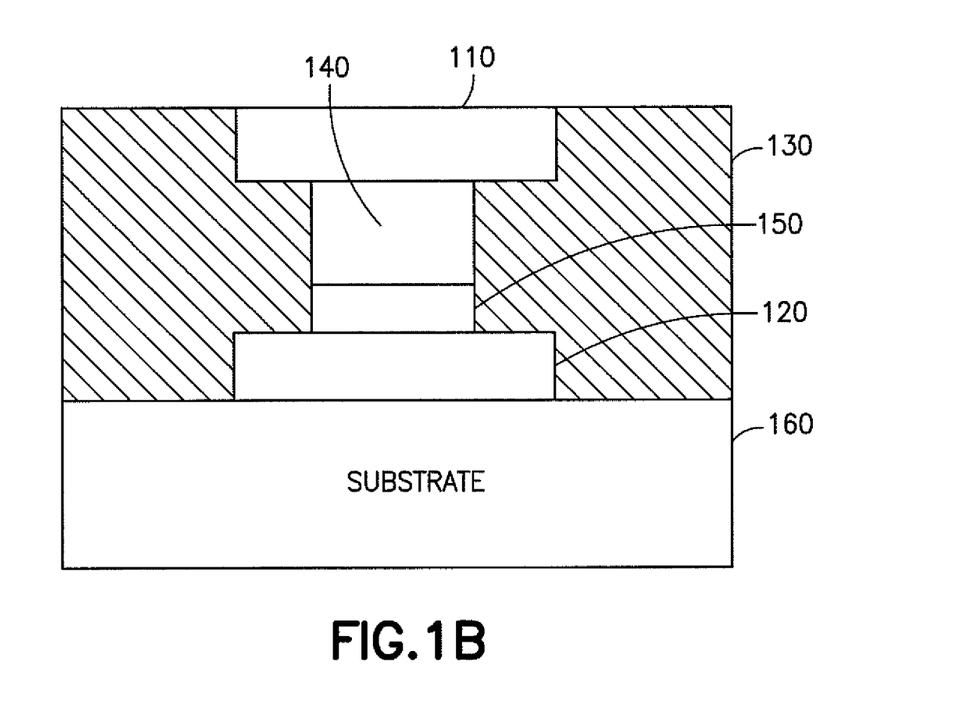
FIG. 1B is a schematic representation of one embodiment of the electronic nanofuse of FIG. 1A having been tripped.
Figure 1C:
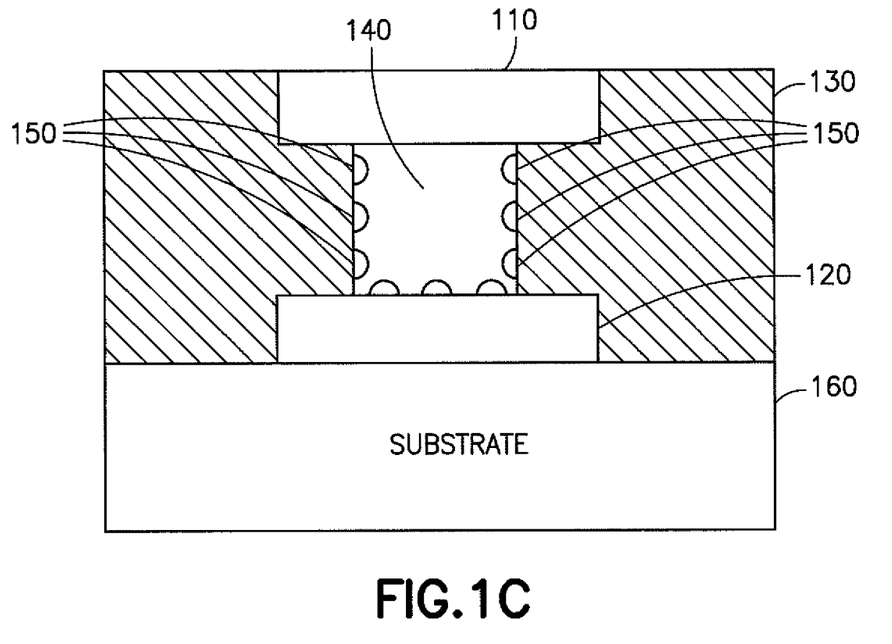
FIG. 1C is a schematic representation of a second embodiment of the electronic nanofuse of FIG. 1A having been tripped.

Referring to FIG. 1B, when a circuit into which the nanofuse 100 is incorporated is shorted, the current from one electrode through the PCM 150 and to the other electrode increases substantially. When the increased current exceeds a predetermined threshold, the PCM 150 heats up and melts, thus losing contact with one of the electrodes 110, 120 and interrupting the flow of current, which causes an open circuit condition. In the example shown in FIG. 1B, when the PCM 150 melts, the PCM 150 no longer contacts the top electrode 110. In some embodiments, as shown in FIG. 10, when the phase change material melts, wetting properties of the phase change material may result in agglomeration of the material on the surfaces on which the material is disposed, thereby breaking the contiguity of the material and interrupting the flow of current. The wetting properties of the surface materials lead to the agglomeration of the phase change material. An oxide surface may be used for dewetting and agglomeration of the phase change material.

Figure 2A:
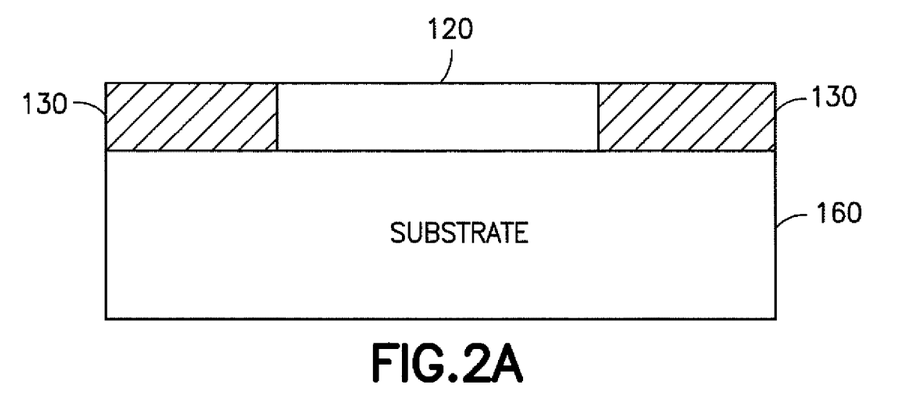
FIG. 2A is a schematic representation of a step of a process of fabricating a nanofuse in which dielectric material and electrode material are deposited onto a substrate.

One example embodiment of a process flow for the fabrication of a nanofuse 100 is described herein. Referring to FIG. 2A, the substrate 160 is provided. The substrate 160 may contain formed electronic device(s) and/or circuits prior to being provided for the fabrication of the nanofuse 100. The substrate 160 can be crystalline, semi-crystalline, microcrystalline, or amorphous. The substrate 160 can be essentially (i.e., except for contaminants) a single element (e.g., silicon), primarily (i.e., with doping) of a single element, for example, silicon (Si) or germanium (Ge), or the substrate 160 can include a compound, for example, GaAs, SiC, or SiGe. The substrate 160 can also have multiple material layers. In some embodiments, the substrate 160 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or similar material(s). In addition, multiple layers of the semiconductor materials can be used as the semiconductor material of the substrate 160. In some embodiments, the substrate 160 includes both semiconductor materials and dielectric materials. The substrate 160 can also include an organic semiconductor or a layered semiconductor such as, for example, Si/SiGe, a silicon-on-insulator or a SiGe-on-insulator. A portion of or the entire substrate 160 can be amorphous, polycrystalline, or monocrystalline.

The dielectric layer 130 can be formed on the substrate 160 using any method known in the art, such as, for example, chemical vapor deposition (CVD), plasma enhanced chemical vapor deposition (PECVD), atomic layer deposition (ALD), or physical vapor deposition (PVD). The dielectric layer 130 can have a thickness ranging from about 10 nm (nanometers) to about 200 nm with about 50 nm being preferred. Materials from which the dielectric layer 130 may be fabricated include ultra-low-k (ULK) materials, such as, for example, porous silicates, carbon doped oxides, silicon dioxides, silicon nitrides, silicon oxynitrides, SiOC, or other dielectric materials. Other materials that may be included in the dielectric layer 130 include, but are not limited to, carbon-doped silicon oxide (SiCOH) and porous variants thereof, silsesquioxanes, siloxanes, or other dielectric materials having, for example, a dielectric constant in the range of about 2 to about 4.

The bottom electrode 120 is formed in the dielectric layer 130 and on a surface of the substrate 160. To form the bottom electrode 120, trenches or openings may be formed into the dielectric layer 130 using any suitable technique (for example, reactive ion etching (RIE)), which are then filled with the material of the bottom electrode 120. The bottom electrode 120 can be any conductive material known in the art, such as, for example, titanium nitride (TiN), tantalum nitride (TaN), titanium (Ti), tantalum (Ta), copper (Cu), aluminum (Al), or tungsten (W), and may be fabricated using any technique known in the art, such as, for example, CVD, PVD, PECVD, ALD, or a single or dual damascene technique. A chemical-mechanical polish (CMP) may be applied to an upper surface of the bottom electrode 120 and the dielectric layer 130 for planarization.

Figure 2B:
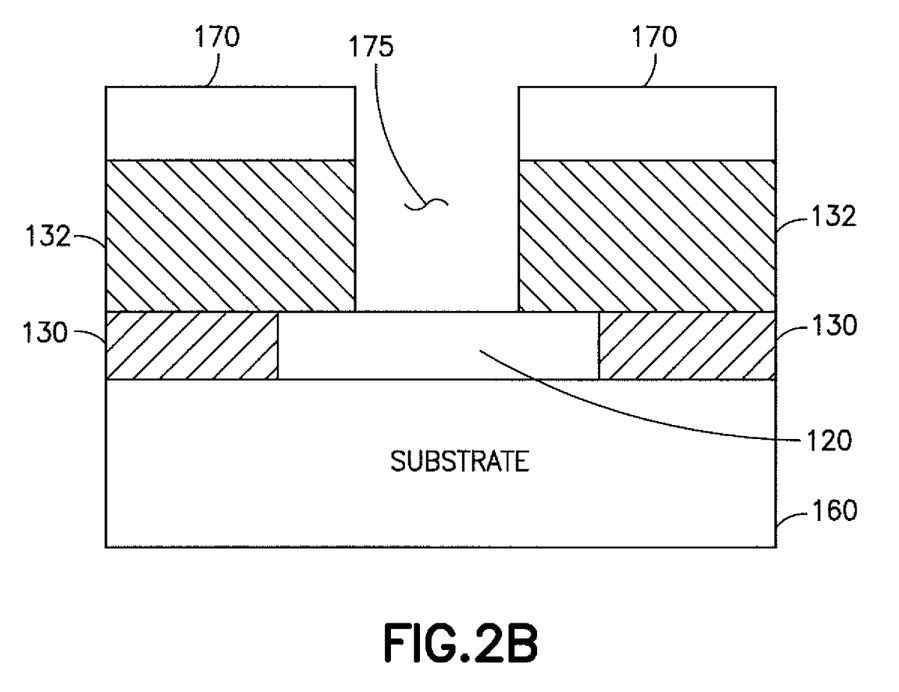
FIG. 2B is a schematic representation of a step of the process in which dielectric material and a hardmask layer are deposited on the dielectric material deposited in FIG. 2A and a trench is formed.

As shown in FIG. 2B, a second dielectric layer 132 is deposited on the planarized upper surface of the bottom electrode 120 and the dielectric layer 130. The second dielectric layer 132 may be a silicon dioxide, which tends to dewet with Ge—Sb—Te (GST) material of the PCM 150 (in embodiments in which the material of the PCM 150 is GST). The second dielectric layer 132 may be conformally deposited using CVD. Variations of CVD processes suitable for forming the second dielectric layer 132 include, but are not limited to, atmospheric pressure CVD (APCVD), low pressure CVD (LPCVD), PECVD, metal-organic CVD (MOCVD), and combinations thereof. The second dielectric layer 132 is patterned, and a pore is lithographically formed (about 10 nm to about 200 nm tall), thereby exposing a portion of the bottom electrode 120. Planarization is carried out as needed.

Figure 2C:
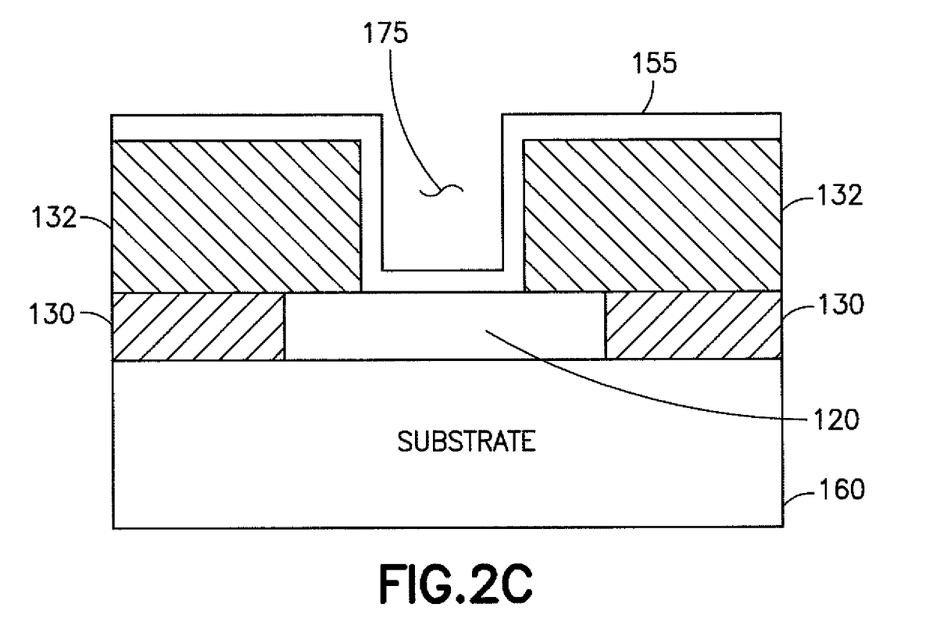
FIG. 2C is a schematic representation of a step of the process in which phase change material is deposited onto surfaces defining the trench shown in FIG. 2B.

As shown in FIG. 2C, the GST material which eventually forms the PCM 150 is shown at 155 (hereinafter "GST material 155") and is conformally deposited onto the planarized upper surface of the second dielectric layer 132, onto walls defining the pore, and onto the exposed portion of the bottom electrode 120 to line the pore such that the GST material 155 as deposited is contiguous over surfaces to define a via structure 175 (about 20 nm to about 80 nm in height). The GST material 155 as deposited is in a substantially amorphous (high resistance) phase. The amorphous (high resistance) phase is formed by heating at least a portion of the GST material 155 to a temperature above the melting point thereof (about 620 degrees C.) by applying a relatively high current through the GST material 155 between electrodes for as little as 10 to 100 nanoseconds. As the GST material 155 cools when the current is interrupted, the atoms of the GST material 155 do not have sufficient time to form an ordered crystalline phase, and the amorphous phase of the GST material 155 results. The conformal GST material 155 can be deposited with a thickness that is less than about 20 nm and by a CVD (also known as "chemical vapor deposition") or HIPIMS (also known as "High Power Impulse Magnetron Sputtering") process.

As alternatives to GST, other suitable materials for the PCM 150 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, Ga—Sb alloys, Al—Sb alloys, and combinations thereof.

Figure 2D:
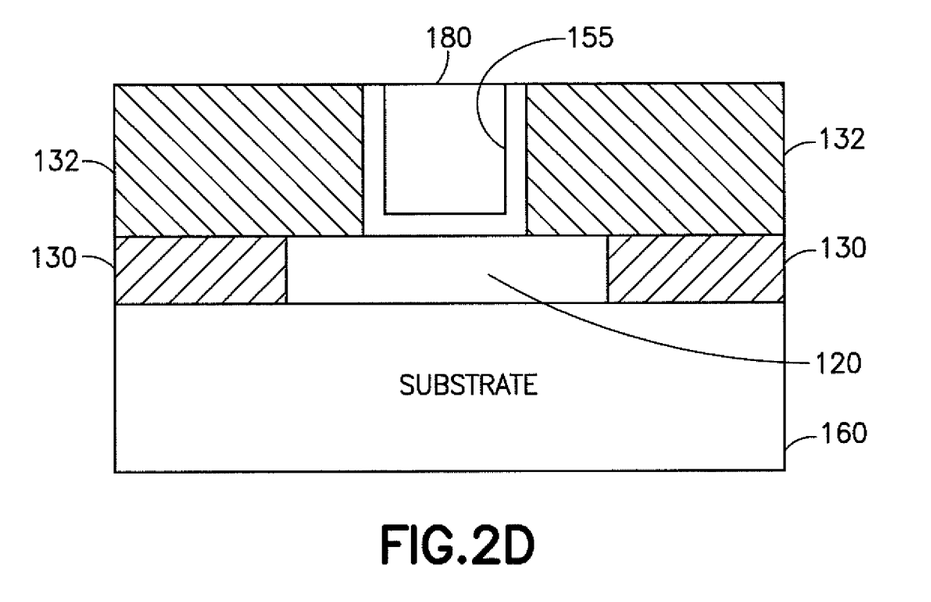
FIG. 2D is a schematic representation of the phase change material in the trench having a sacrificial dielectric material deposited thereon.

Referring now to FIG. 2D, a dielectric fill 180 is deposited into the lined trench 175. The dielectric fill 180 may be a sacrificial nitride material. A CMP is carried out to remove the nitride material and the GST material 155 from the upper surface of the second dielectric layer 132.

Figure 2E:
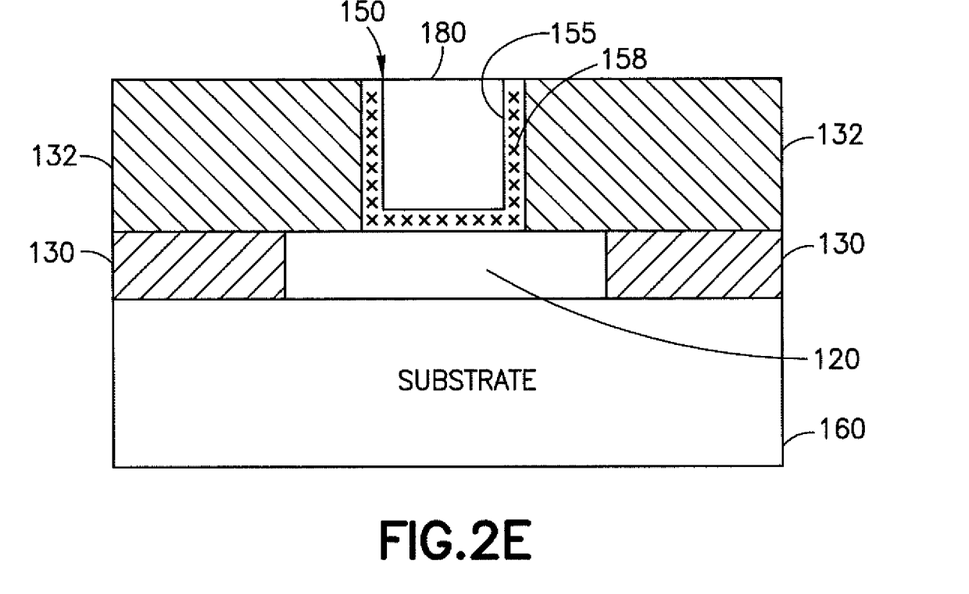
FIG. 2E is a schematic representation of the phase change material in the trench in a crystalline phase.

Referring to FIG. 2E, an anneal is carried out to change the GST material 155 from the substantially amorphous (high resistance) phase to a crystalline phase 158, thereby forming the PCM 150. In annealing to form the crystalline (low resistance) phase, at least a portion of the GST material 155 is heated to a temperature of about 550 degrees C., which is above the crystallization temperature and near (but below) the melting point of the GST material 155, by applying a relatively lower current through the GST material 155 between the electrodes for a sufficient amount of time (for example, as little as about 30 nanoseconds) to allow the atoms of the GST material 155 to assume the long-range order associated with the crystalline phase 158, after which the current flowing through the material can be interrupted. In the event the volume of the GST material 155 shrinks and recedes below the upper surface of the second dielectric layer 132 and/or the dielectric fill 180 in the trench, a touch up of CMP can be carried out.

Figure 2F:
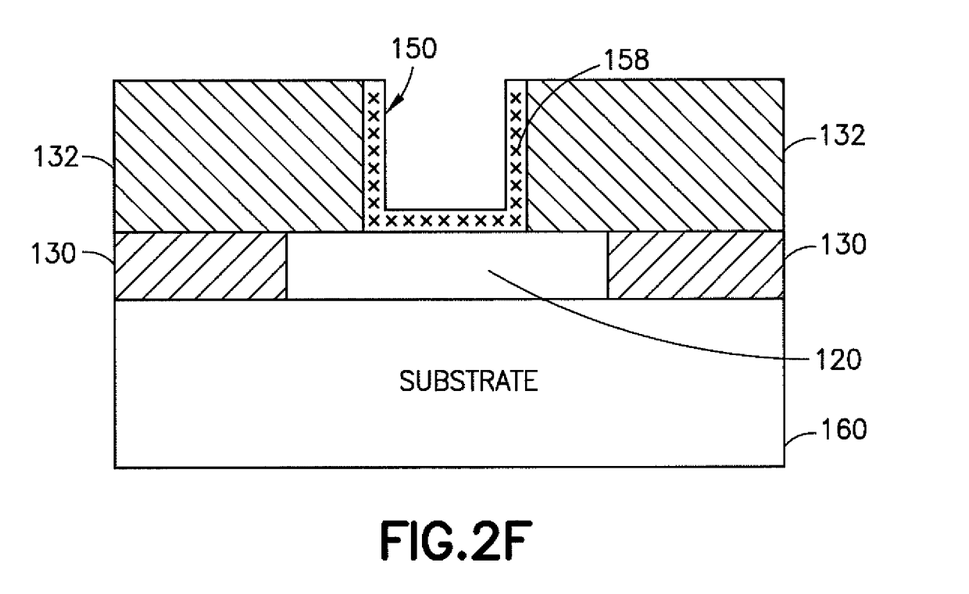
FIG. 2F is a schematic representation of a step in which the sacrificial dielectric material is removed.

Referring now to FIG. 2F, selective removal of the sacrificial nitride material of the dielectric fill 180 is carried out. The removal of the sacrificial nitride material may be by application of dilute hydrofluoric acid (DHF) (generally about 1000:1 DHF). In some exemplary embodiments, the trench 175 (once the dielectric fill 180 is removed) may be filled with an organic material followed by CMP and ashing with carbon dioxide.

Figure 2G:
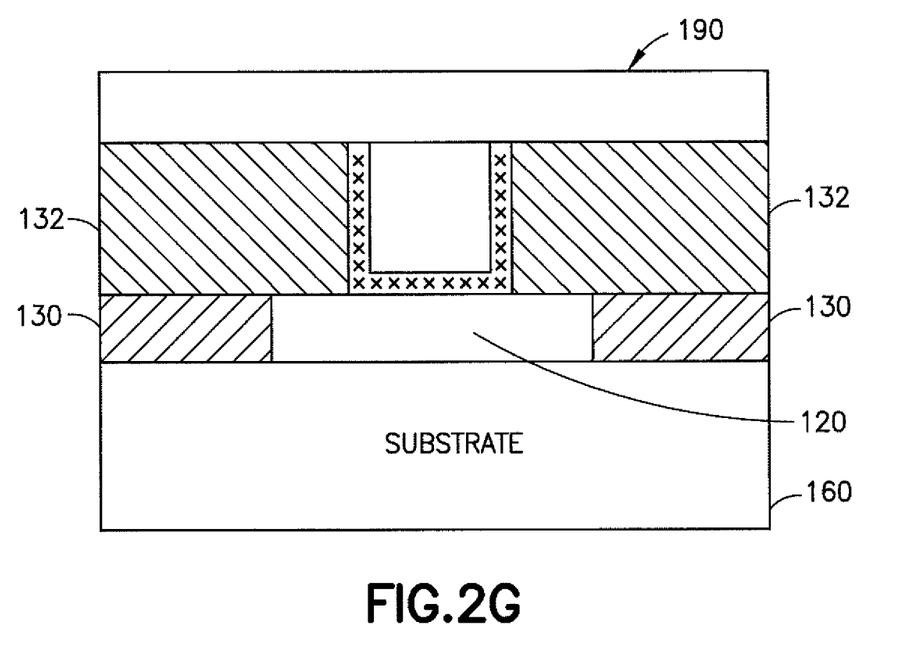
FIG. 2G is a schematic representation of a step in which a metal bridge is formed over the trench.

Referring now to FIG. 2G, material is deposited onto the upper surface of the second dielectric layer 132 to form a bridge 190 over the air gap. The material of the bridge 190 can include a conductive material, such as Cu, Al, Ag, Au, Pt, W, etc. In some embodiments, the material of the bridge 190 can include nitrides such as TiN, TaN, Ta, or Ru. In some embodiments, the material of the bridge 190 may be carbon nanotubes, carbon fullerenes, refractory metals, and/or other materials. The bridge 190 can be formed by any suitable deposition process such as CVD, ALD, PVD, damascene, dual-damascene, and/or other suitable processes to a thickness of about 10 nm to about 200 nm with about 25 nm being preferred.

Figure 2H:
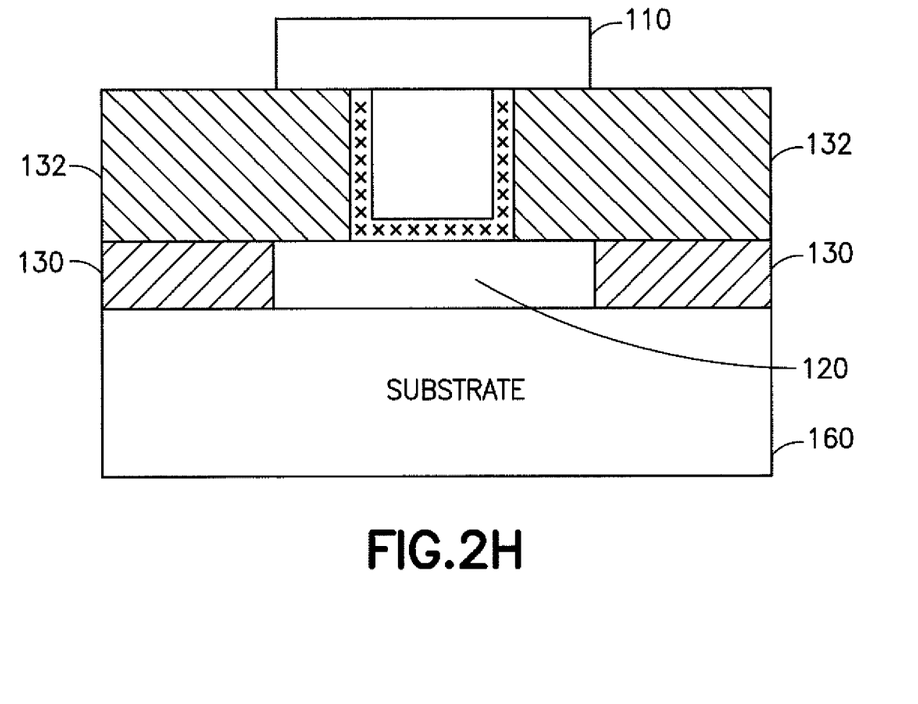
FIG. 2H is a schematic representation of a step in which portions of the metal bridge are removed to form a top electrode.

Referring now to FIG. 2H, the bridge 190 is patterned and portions thereof are etched to expose the upper surface of the second dielectric layer 132, thereby forming the top electrode 110.

Figure 2I:
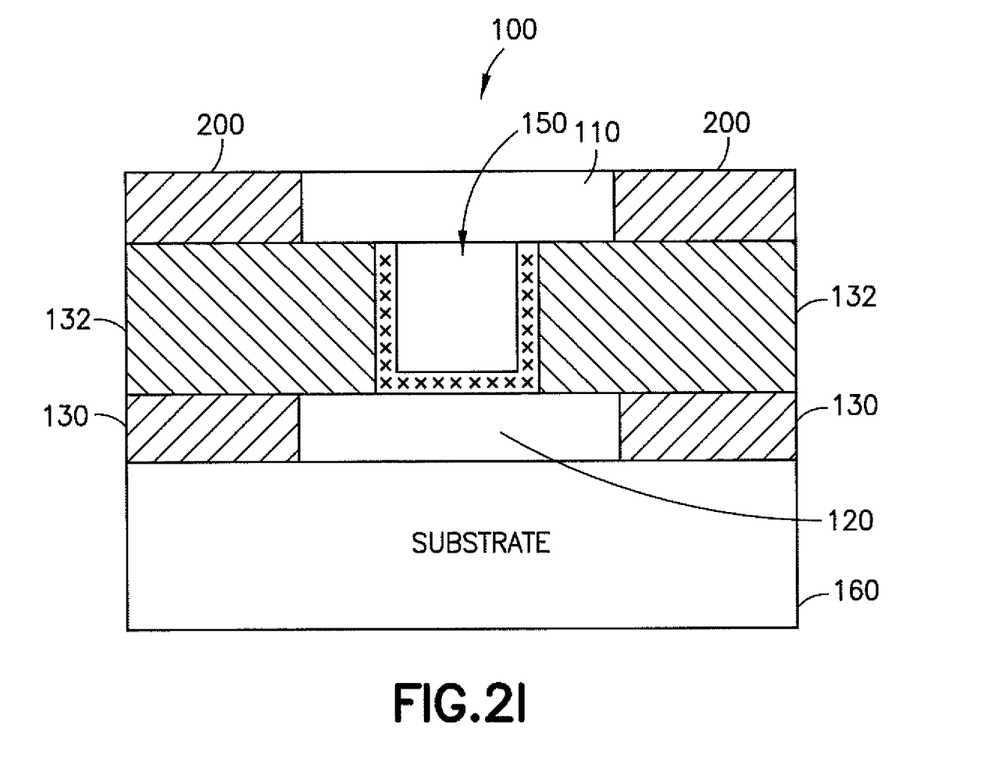
FIG. 2I is a schematic representation of a step in which dielectric material is deposited adjacent to the top electrode to form the electronic nanofuse.

Referring now to FIG. 2I, exposed portions of the upper surface of the second dielectric layer 132 are filled with a dielectric material 200. Upper surfaces of the dielectric material 200 and the top electrode 110 can then be planarized, thereby forming the electronic nanofuse 100.

Figure 3A:
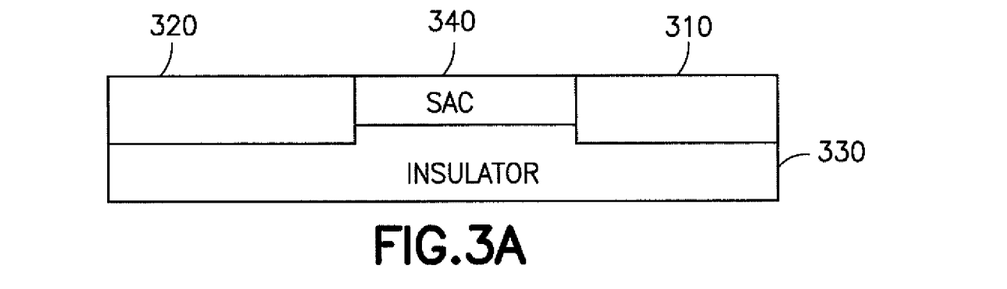
FIG. 3A is a cross-sectional schematic representation of a step in forming another example embodiment of a nanofuse.
Figure 3B:
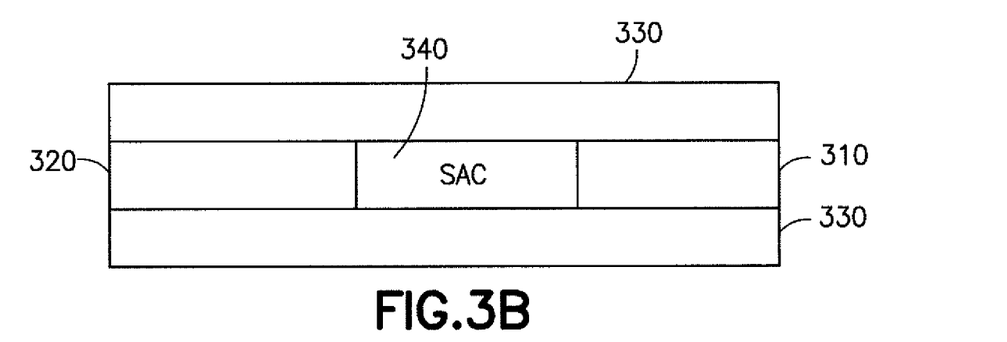
FIG. 3B is a top view of the schematic representation of FIG. 3A.

Referring now to FIGS. 3A through 3F, another example embodiment of a process flow for the fabrication of a nanofuse 300 is described herein. As shown in FIGS. 3A and 3B, a first contact 310 and a second contact 320 are disposed on an insulator 330 or dielectric (such as silicon dioxide, fluorinated tetraethyl orthosilicate (FTEOS), or any low-k dielectric material) in-plane with a sacrificial material 340 on the insulator 330 and separating the first contact 310 and the second contact 320. As shown in FIG. 3B (top down view), the first contact 310, the second contact 320, and the sacrificial material 340 may be disposed in a trench. Planarization may be carried out as needed such that upper surfaces of the insulator 330, the first contact 310, the second contact 320, and the sacrificial material 340 are planar. The sacrificial material 340 may be, for example, SiN.

Figure 3C:
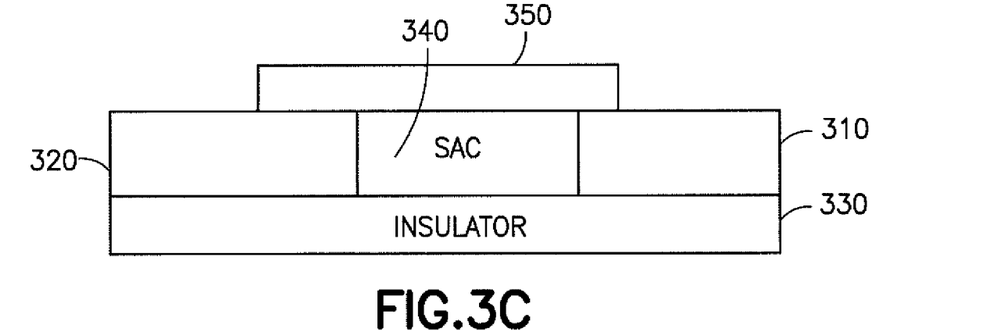
FIG. 3C is a cross-sectional schematic representation of a step in forming the nanofuse of FIG. 3A in which a phase change material is deposited.
Figure 3D:
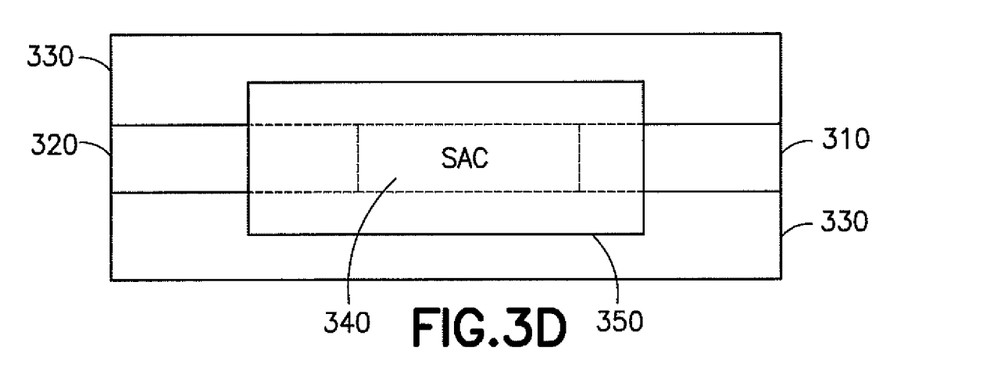
FIG. 3D is a top view of the schematic representation of FIG. 3C.

Referring now to FIGS. 3C and 3D, a PCM 350 may be blanket-deposited on the sacrificial material 340 using any suitable technique as described herein. A shape of the PCM 350 is defined using any suitable patterning technique. As shown in FIG. 3D, the patterned PCM 350 may overlay and extend beyond the edges of the sacrificial material 340. The PCM 350 is changed from an amorphous phase to a crystalline phase, for example, by annealing.

Figure 3E:
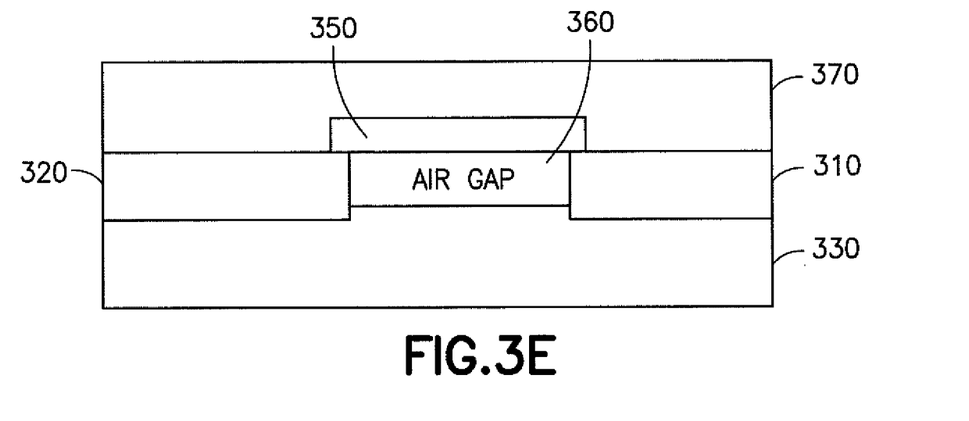
FIG. 3E is a cross-sectional schematic representation of a step in forming the nanofuse of FIG. 3A in which an air gap is formed and a wetting dielectric is deposited.
Figure 3F:
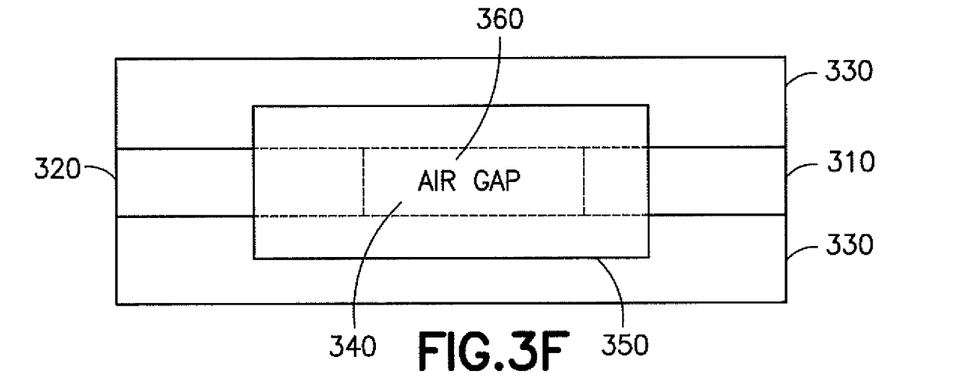
FIG. 3F is a top view of the schematic representation of FIG. 3E.

Referring now to FIGS. 3E and 3F, a subway etch technique is carried out to remove the sacrificial material 340, thereby leaving an air gap 360 between the first contact 310, the second contact 320, the insulator 330, and the PCM 350. A wetting dielectric 370 is disposed over the first contact 310, the second contact 320, the PCM 350, and the upper surfaces of the insulator 330.

Figure 3G:
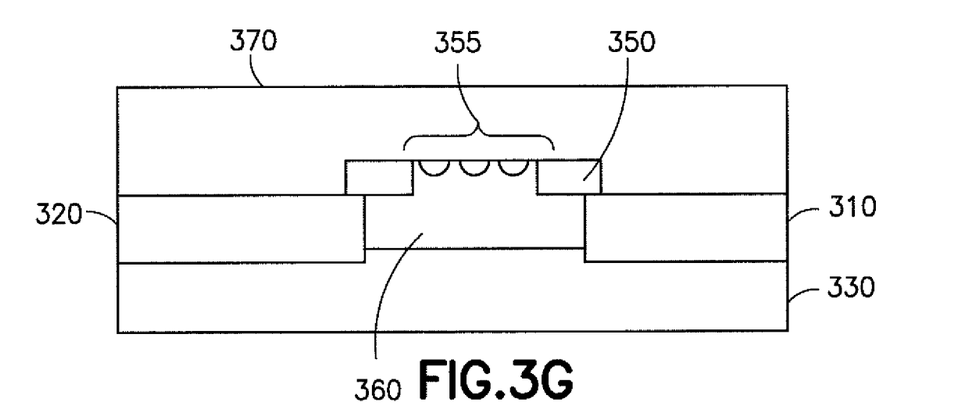
FIG. 3G is a cross-sectional schematic representation of the nanofuse of FIG. 3A after being tripped.

Referring now to FIG. 3G, upon triggering a condition that causes the PCM 350 to melt, the material of the PCM 350 may agglomerate (shown at 355) in the air gap 360 and on the surface of the wetting dielectric 370, thereby interrupting continuity between the first contact 310 and the second contact 320.

Figure 4A:
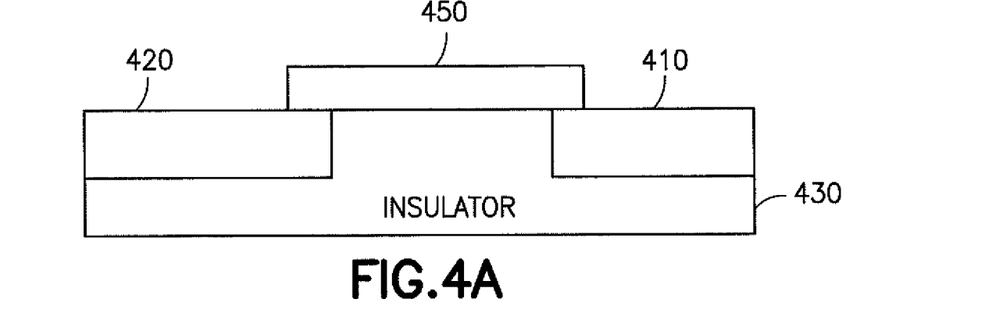
FIG. 4A is a cross-sectional schematic representation of another example embodiment of a nanofuse.
Figure 4B:
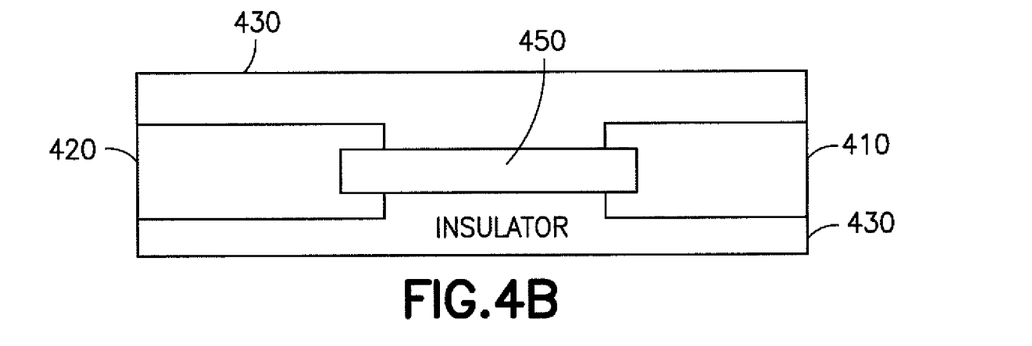
FIG. 4B is a top view of the nanofuse of FIG. 4A.

Referring now to FIGS. 4A through 4D, another example embodiment of a process flow for the fabrication of a nanofuse 400 is described herein. As shown in FIGS. 4A and 4B, a first contact 410 and a second contact 420 may be disposed in an insulator 430 such that material of the insulator 430 separates the contacts. A PCM 450 may be deposited using any suitable technique between the first contact 410 and the second contact 420. As shown in FIG. 4B, the PCM 450 may extend directly between the first contact 410 and the second contact 420. As with previous embodiments, the PCM 450 is deposited in the amorphous phase and is changed to a crystalline phase, for example, by annealing.

Figure 4C:
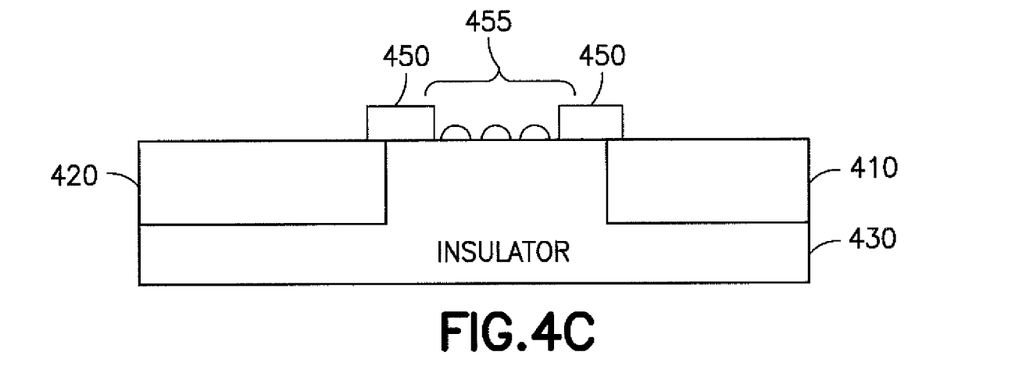
FIG. 4C is a cross-sectional schematic representation of the nanofuse of FIG. 4A after being tripped.
Figure 4D:
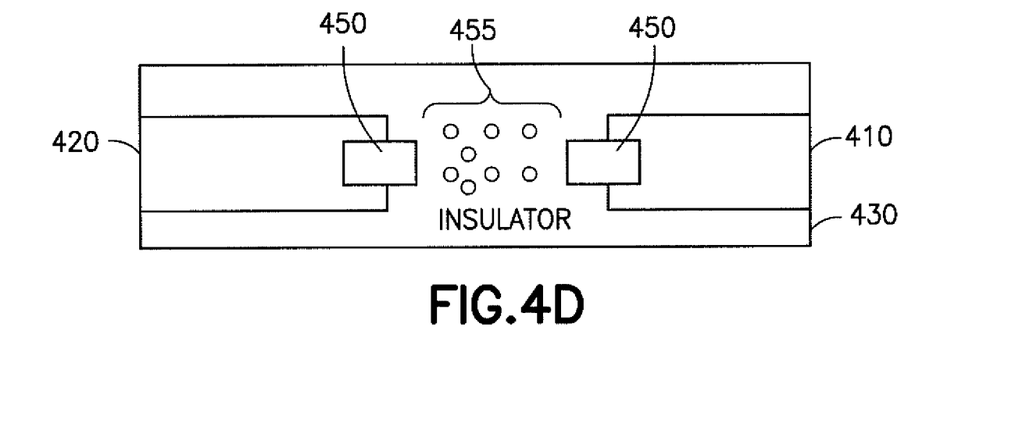
FIG. 4D is a top view of the nanofuse of FIG. 4C.

Referring now to FIGS. 4C and 4D, upon triggering of a condition that causes the PCM 450 to melt, the material of the PCM 450 agglomerates (shown at 455) on the surface of the insulator 430, thereby interrupting continuity between the first contact 410 and the second contact 420.

Figure 5A:
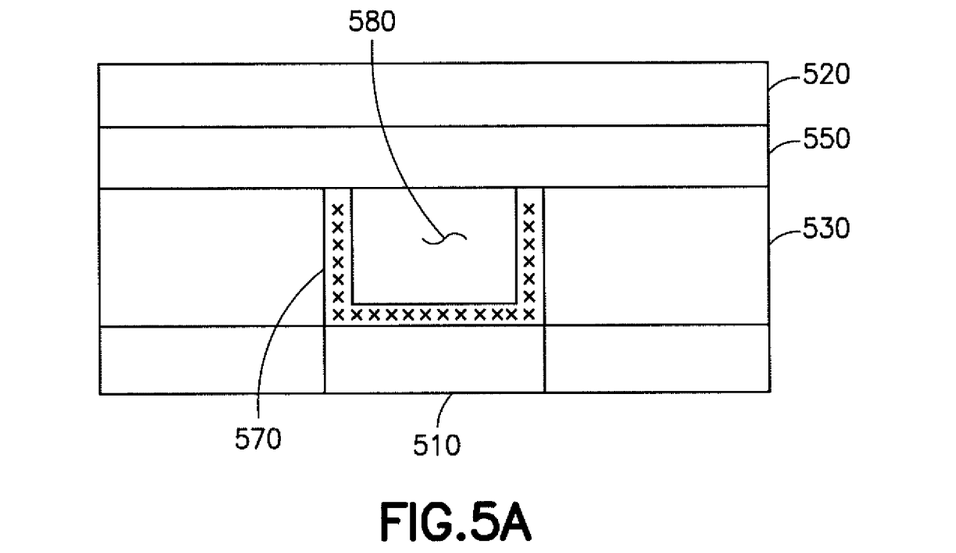
FIG. 5A is a cross-sectional schematic representation of another example embodiment of a nanofuse.
Figure 5B:
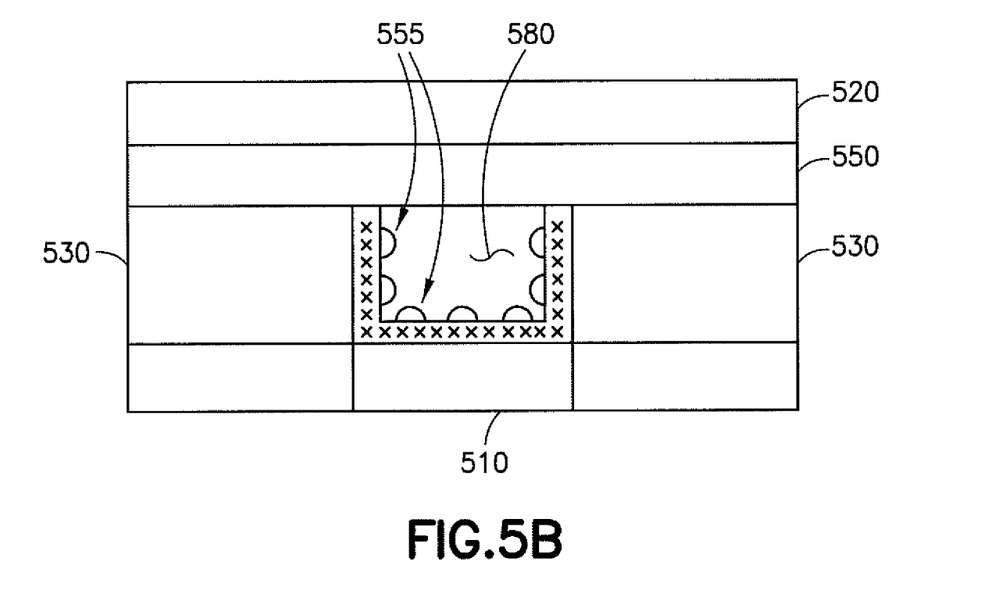
FIG. 5B is a cross-sectional schematic representation of the nanofuse of FIG. 5A after being tripped.

Referring now to FIGS. 5A and 5B, another example embodiment of a process flow for the fabrication of a nanofuse 500 (or "anti-fuse") is described herein. The nanofuse 500 exhibits a resistance in the mega-ohm range. As shown in FIG. 5A, the process for fabricating the nanofuse 500 is similar to the process for fabricating the nanofuse 100 described above. Structurally, the nanofuse 500 comprises a first contact 510 disposed in layers of insulator material 530. A void is defined in the insulator material 530 to form an air gap 580 over the first contact 510. Surfaces of the air gap 580 include a conductive liner 570 disposed thereon. The conductive liner 570 may be, for example, TaN. A PCM 550 may form a bridge over the air gap 580 and the insulator material 530. A second contact 520 may be disposed over the PCM 550.

As shown in FIG. 5B, upon triggering a condition that causes the PCM 550 to melt, the material of the PCM 550 wets into the conductive liner 570 (shown at 555), thereby causing the resistance to drop substantially (for example, into the kilo-ohm range).

In one example, a semiconductor structure comprises a first electrode; a second electrode; a dielectric material between the first electrode and the second electrode, the dielectric material having at least one wall extending from the first electrode to the second electrode to define a void within the dielectric material and between the first electrode and the second electrode; and a layer of phase change material on the at least one wall of the dielectric material and in contact with the first electrode and the second electrode.

The first electrode may be one or more of titanium nitride or tantalum nitride. The second electrode may be one or more of titanium nitride or tantalum nitride. The phase change material may be Ge—Sb—Te. The phase change material may be in a crystalline phase at a first temperature and may be configured to transition to an amorphous phase at a second temperature higher than the first temperature. The dielectric material may comprise at least one of a porous silicate, a carbon doped oxide, a silicon dioxide, a silicon nitride, a silicon oxynitride, SiOC, a carbon-doped silicon oxide, porous variants of any of the foregoing materials, a silsesquioxane, or a siloxane.

In another example, a method of forming an electronic fuse comprises providing a first dielectric layer on a substrate; forming a trench in the first dielectric layer; forming a first electrode in the trench; depositing a second dielectric layer on the first electrode and the first dielectric layer; forming a pore in the second dielectric layer to expose a portion of the first electrode; depositing a layer of phase change material, in an amorphous phase, on at least one wall of the pore and contacting the first electrode such that a void is defined in the pore; filling the defined void with a sacrificial material; causing the phase change material to assume a crystalline phase; removing the sacrificial material to redefine the void; forming a metal bridge over the void; removing portions of the metal bridge to expose the second dielectric layer; and covering the exposed second dielectric layer with a third dielectric layer.

The pore may be formed using a lithographic process. The trench may be formed in the first dielectric layer using an etching process. The method may further comprise planarizing upper surfaces of the first dielectric layer and the first electrode. The method may further comprise depositing a hardmask layer on the second dielectric layer before forming the pore. Depositing a layer of phase change material on at least one wall of the pore may comprise conformally depositing the phase change material by physical vapor deposition onto the at least one wall of the pore and onto an upper surface of the second dielectric layer. The method may further comprise, after filling the defined void with a sacrificial material, planarizing upper surfaces of the sacrificial material and the phase change material to expose the second dielectric layer, the phase change material, and the sacrificial material. Causing the phase change material to assume the crystalline phase may comprise annealing. Forming the metal bridge over the void may comprise depositing a material by at least one of chemical vapor deposition, atomic layer deposition, physical vapor deposition, damascene, or dual-damascene. Removing portions of the metal bridge to expose the second dielectric layer may comprise patterning the bridge and etching to expose the upper surface of the second dielectric layer.

In another example, a method of forming an electronic fuse comprises forming a first electrode on an insulating layer; forming a second electrode on the insulating layer and in-plane with the first electrode; depositing a sacrificial material on the insulating material between and separating the first electrode and the second electrode; depositing a phase change material, in an amorphous phase, onto and overlaying the sacrificial material such that the sacrificial material extends over at least a portion of the first electrode, at least a portion of the second electrode, all of the sacrificial material, and at least a portion of the insulating layer; causing the phase change material to assume a crystalline phase; removing the sacrificial material to form an air gap; and depositing a wetting dielectric on the phase change material.

Causing the phase change material to assume a crystalline phase may comprise annealing. Removing the sacrificial material may comprise using a subway etching technique. The phase change material may overlay and extend beyond the edges of the sacrificial material.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A semiconductor structure, comprising:
   a first electrode;
   a second electrode;
   a dielectric material between the first electrode and the second electrode, the dielectric material having at least one wall extending from the first electrode to the second electrode; and
   a layer of phase change material on and in contact with the at least one wall of the dielectric material and in contact with the first electrode and the second electrode, a material of the at least one wall configured for at least one of dewetting or agglomeration of the phase change material, the layer of phase change material defining a void within the dielectric material and between the first electrode and the second electrode, wherein the void is partially defined by a surface of at least one of the first electrode or the second electrode.

2. The semiconductor structure of claim 1, wherein the first electrode is one or more of titanium nitride or tantalum nitride.

3. The semiconductor structure of claim 1, wherein the second electrode is one or more of titanium nitride or tantalum nitride.

4. The semiconductor structure of claim 1, wherein the phase change material is Ge—Sb—Te.

5. The semiconductor of claim 1, wherein the phase change material is in a crystalline phase at a first temperature and is configured to transition to an amorphous phase at a second temperature higher than the first temperature.

6. The semiconductor of claim 1, wherein the dielectric material comprises at least one of a porous silicate, a carbon doped oxide, a silicon dioxide, a silicon nitride, a silicon oxynitride, SiOC, a carbon-doped silicon oxide, porous variants of any of the foregoing materials, a silsesquioxane, or a siloxane.

* * * * *